United States Patent
Leisl, III et al.

(10) Patent No.: US 9,803,310 B1
(45) Date of Patent: Oct. 31, 2017

(54) APPLIANCE INTERFACE AND INPUT CHASSIS

(71) Applicant: Haier US Appliance Solutions, Inc., Wilmington, DE (US)

(72) Inventors: Donald James Leisl, III, Louisville, KY (US); Craig Robert Vitan, Louisville, KY (US); Sripad Kulkarni, Hyderabad (IN)

(73) Assignee: Haier US Appliance Solutions, Inc., Wilmington, DE (US)

( * ) Notice: Subject to any disclaimer, the term of this patent is extended or adjusted under 35 U.S.C. 154(b) by 0 days.

(21) Appl. No.: 15/207,555

(22) Filed: Jul. 12, 2016

(51) Int. Cl.
| H03K 17/975 | (2006.01) |
| D06F 39/00 | (2006.01) |
| H03K 17/96 | (2006.01) |
| D06F 33/02 | (2006.01) |

(52) U.S. Cl.
CPC ........... D06F 39/005 (2013.01); D06F 33/02 (2013.01); H03K 17/9622 (2013.01); *H03K 2217/960755* (2013.01)

(58) Field of Classification Search
CPC ... D06F 39/005; D06F 33/02; H03K 17/9622; H03K 2217/960755; H01H 5/00; H01H 5/06; H01H 13/00; H01H 13/20; H01H 13/50; H01H 13/70; H01H 2003/12; H01H 2221/00; H01H 2221/002; H01H 2223/01; H01H 2223/014; H01H 2223/03; H01H 2223/034; H01H 2231/012; H01H 2215/034

USPC .... 200/600, 517, 430, 521, 276.1, 457, 409, 200/458, 520, 537, 341, 345
See application file for complete search history.

(56) References Cited

U.S. PATENT DOCUMENTS

| 4,315,114 A | * | 2/1982 | Monti, Jr. | ............ H01H 13/705 200/343 |
| 5,422,447 A | * | 6/1995 | Spence | ...................... B41J 5/12 200/343 |
| 5,715,932 A | * | 2/1998 | Motoyama | ............. H01H 13/50 200/345 |
| 6,259,046 B1 | * | 7/2001 | Iwama | ............... H01H 13/7006 200/5 A |
| 2015/0295576 A1 | * | 10/2015 | Ertas | ................... A47L 15/4293 200/5 A |

FOREIGN PATENT DOCUMENTS

WO    WO2013064572 A1    5/2013

* cited by examiner

*Primary Examiner* — Anthony R. Jimenez
(74) *Attorney, Agent, or Firm* — Dority & Manning, P.A.

(57) ABSTRACT

An appliance, including an interface and input chassis is provided. Appliance may include a contact plate, a conductive spring, and a support wall. The input chassis may define a connection aperture extending therethrough. The contact plate may be disposed above the connection aperture of the input chassis. The contact plate may include a top surface facing away from the input chassis and a bottom surface facing toward the input chassis. The conductive spring may be coupled the contact plate at the bottom surface of the contact plate. The conductive spring may extend through the connection aperture. The support wall may be attached to the input chassis and disposed about the conductive spring between the contact plate and the connection aperture of the input chassis.

9 Claims, 6 Drawing Sheets

APPLIANCE INTERFACE AND INPUT CHASSIS

FIELD OF THE INVENTION

The present subject matter relates generally to appliances, and more particularly to user interfaces for appliances.

BACKGROUND OF THE INVENTION

Appliances, such as washing machine appliances, generally include one or more user interfaces. A user interface is often provided to receive instructions or provide feedback to a user regarding operation of the appliance. For instance, a display and/or one or more input selectors may be provided as part of a user interface.

In the case of washing machine appliances, a cabinet having a tub for containing wash fluid, e.g., water and detergent, bleach, and/or other fluid additives, is included. A basket is rotatably mounted within the tub and defines a wash chamber for receipt of articles for washing. During operation of such washing machine appliances, wash fluid is directed into the tub and onto articles within the wash chamber of the basket. The basket and/or an agitation element can rotate at various speeds to, e.g., agitate articles within the wash chamber, wring wash fluid from articles within the wash chamber, etc. A user interface is often provided with a one or more input selector components. Such components may display information about the appliance or allow certain operations or wash cycles to be selected by a user. In some cases, the user interface may have a capacitance button connected to a circuit board, for instance, by a conductive spring. However, air gaps may form over time between the conductive spring and one or more portions of the user interface. These air gaps may lead to input errors and may cause the user interface to become unresponsive. Moreover, although it might be advantageous to assemble some portions of the user interface separately or in advance, current designs may make pre-assembly difficult or unfeasible. For instance, movement of a pre-assembled portion of the user interface may increase the potential for air gaps to form.

There is a need, therefore, for a user interface that reduces the potential for air gap formation. Moreover, it would be advantageous if a user interface could be at least partially pre-assembled without increasing the potential for air gaps to form during shipping or movement of the pre-assembled portions.

BRIEF DESCRIPTION OF THE INVENTION

Aspects and advantages of the invention will be set forth in part in the following description, or may be obvious from the description, or may be learned through practice of the invention.

In one aspect of the present disclosure, an appliance is provided. The appliance may include an input chassis, a contact plate, a conductive spring, and a support wall. The input chassis may define a connection aperture extending therethrough. The contact plate may be disposed above the connection aperture of the input chassis. The contact plate may include a top surface facing away from the input chassis and a bottom surface facing toward the input chassis. The conductive spring may be coupled the contact plate at the bottom surface of the contact plate. The conductive spring may extend through the connection aperture. The support wall may be attached to the input chassis and disposed about the conductive spring between the contact plate and the connection aperture of the input chassis.

In another aspect of the present disclosure, an appliance is provided. The appliance may include an input chassis, a contact plate, a conductive spring, a printed circuit board, and a support wall. The input chassis may define a connection aperture extending therethrough. The contact plate may be disposed above the connection aperture of the input chassis. The contact plate may include a top surface facing away from the input chassis and a bottom surface facing toward the input chassis. The conductive spring may be fixed to the bottom surface of the contact plate. The conductive spring may extend through the connection aperture. The printed circuit board may be fixed to the conductive spring below the input chassis. The support wall may be attached to the input chassis and disposed about the conductive spring between the contact plate and the connection aperture of the input chassis. The support wall may include a resilient arm extending to the input chassis.

In yet another aspect of the present disclosure, an appliance is provided. The appliance may include a cabinet, an interface bracket, and a user interface. The cabinet may define an opening for the receipt of articles to be treated. The interface bracket may be disposed on the cabinet. The user interface may be disposed on the interface bracket, and may include an input chassis, a contact plate, a conductive spring, and a support wall. The input chassis may define a connection aperture extending therethrough. The contact plate may be disposed above the connection aperture. The contact plate may include a top surface facing away from the input chassis and a bottom surface facing toward the input chassis. The conductive spring may be fixed to the bottom surface of the contact plate. The conductive spring may extend through the connection aperture. The support wall may be attached to the input chassis and disposed about the conductive spring between the contact plate and the connection aperture.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
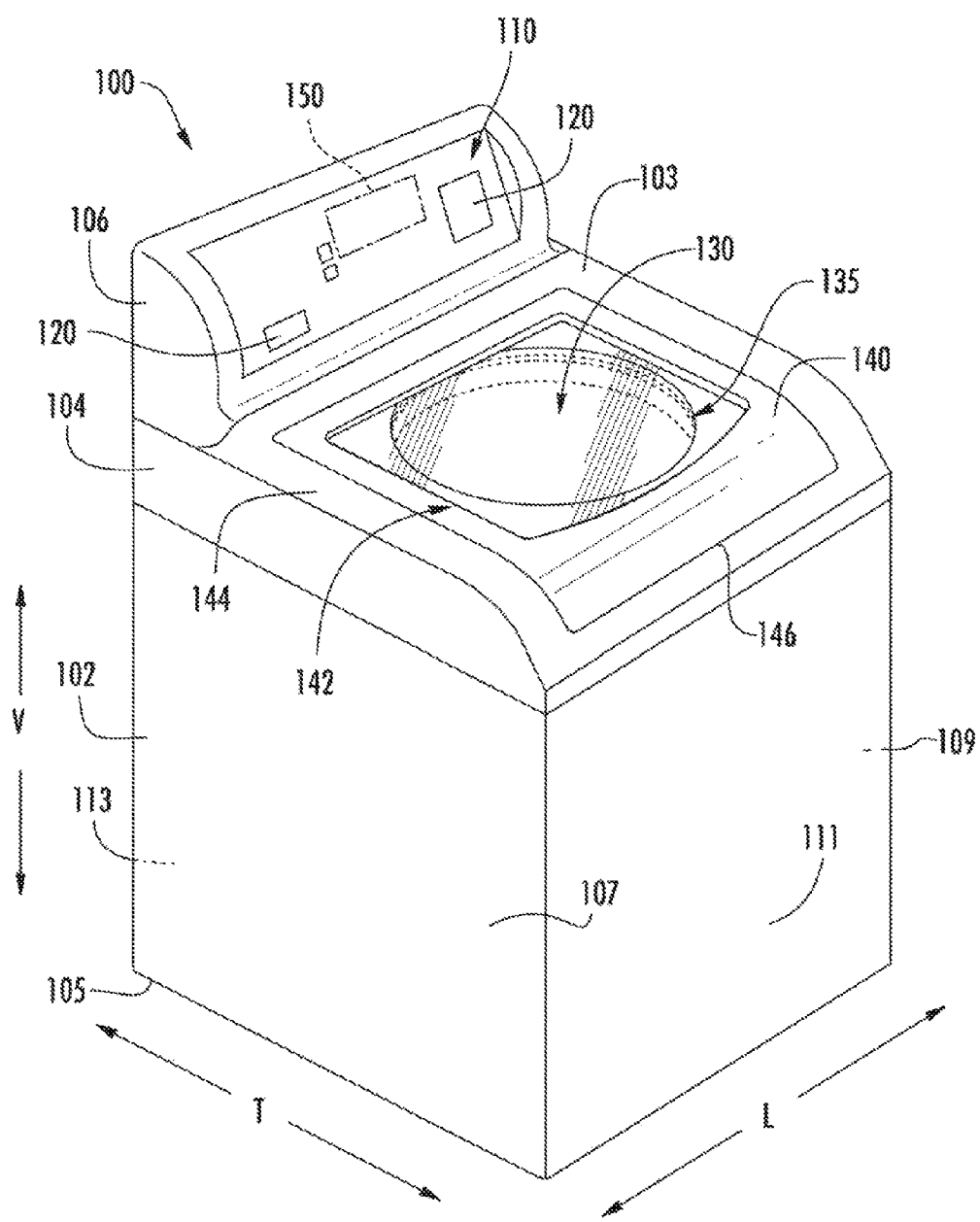
FIG. 1 provides a perspective view of a washing machine appliance according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present subject matter provides an appliance that includes a user interface that limits or prevents the formation of air gaps at a conductive spring for a capacitance detection circuit. The user interface may be configured such that a contact plate holds the conductive spring in compression against a circuit board without significantly increasing the force applied to the circuit board.

As may be seen in FIG. 1, an appliance, such as a washing machine appliance 100, may be provided with a user interface 110 to control certain functions thereof. The appliance 100 may also include a cabinet 102 that defines a vertical direction V, a lateral direction L, and a transverse direction T. The vertical direction V, lateral direction L, and transverse direction T are all mutually perpendicular and form an orthogonal appliance direction system. Generally, cabinet 102 extends between a top portion 103 and a bottom portion 105 along the vertical direction V. Cabinet 102 also extends between a first side portion 107 and a second side portion 109, e.g., along the lateral direction L, and a front portion 111 and a rear portion 113, e.g., along the transverse direction T. Although appliance 100 is illustrated as a washing machine appliance, other embodiments may be provided as additional or alternative appliances, such as a dryer appliance, dishwasher appliance, refrigerator appliance, etc. Thus, while described in greater detail below in the context of washing machine appliance 100, the present subject matter may be used in or with any other suitable appliance in alternative exemplary embodiments.

In exemplary embodiments, such as that of FIG. 1, cabinet 102 has a top cover 104 positioned at or adjacent top portion 103 of cabinet 102. Top cover 104 defines an opening 135 that permits user access to wash chamber 130 of wash basket 120. Door 140 is pivotally attached to top cover 104. However, alternatively, door 140 may be mounted to cabinet 102 or another suitable support. Door 140 selectively rotates a closed position and an open position. In the closed position, door 140 is positioned over opening 135 and inhibits access to wash chamber 130. Conversely, in the open position, a user can access wash chamber 130 through opening 135. Door 140 also includes a handle 146 that, e.g., a user may pull and/or lift when opening and closing door 140.

Door 140 includes a pivotable frame 144 that defines an aperture above the wash chamber 130. A discrete panel 142 extends across the aperture such that panel 142 is bounded by a portion of pivotable frame 144 and restricts access through door 140. In some embodiments, panel 142 is configured as a window. For instance, panel 140 may be embodied as a transparent plastic or glass pane. In such embodiments, panel 142 may permit viewing of wash chamber 130 when door 140 is in the closed position, e.g., during operation of washing machine appliance 100.

A backsplash 106 extends from cover 104. A user interface 110 may be provided on or within the backsplash 106. As will be described in greater detail below, user interface may include one or more control input selectors 120 that are included with or coupled to backsplash 106, e.g., to control operation of the appliance 100. Generally, input selectors 120 provide an interface whereby the user may operate the machine and select various operation features of the appliance 100. Input selectors 120 can be of a touch type such as touchpad or may include more traditional knobs and dials. A display may also be provided on backsplash 106 for notifying the user of various aspect of the machine's operation including e.g., the mode of operation, water temperature selected, and other relevant information.

Washing machine appliance 100 is controlled by a processing device or controller 150, such as a microprocessor, according to user preference via manipulation of control input selectors 120 mounted on backsplash 106. As used herein, processing device 150 may refer to one or more microprocessors or semiconductors devices and is not restricted necessarily to a single element. The processing device 150 can be programmed to operate washing machine 100 according to features desired by the consumer.

Figure 2:
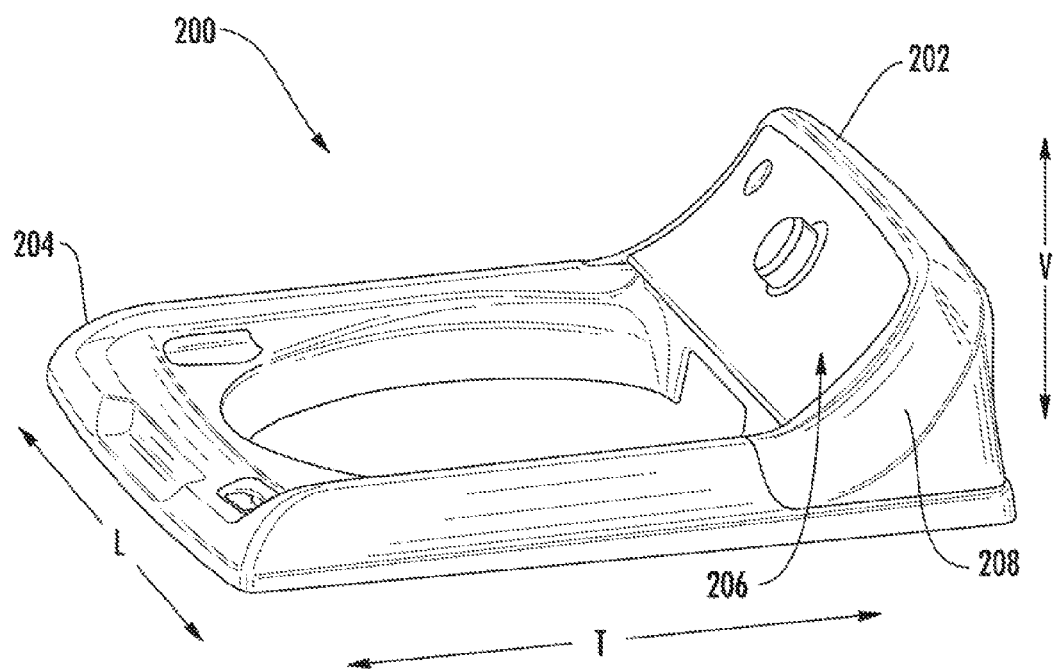
FIG. 2 provides a perspective view of a top cover assembly for a washing machine appliance according to an exemplary embodiment of the present disclosure.
Figure 3:
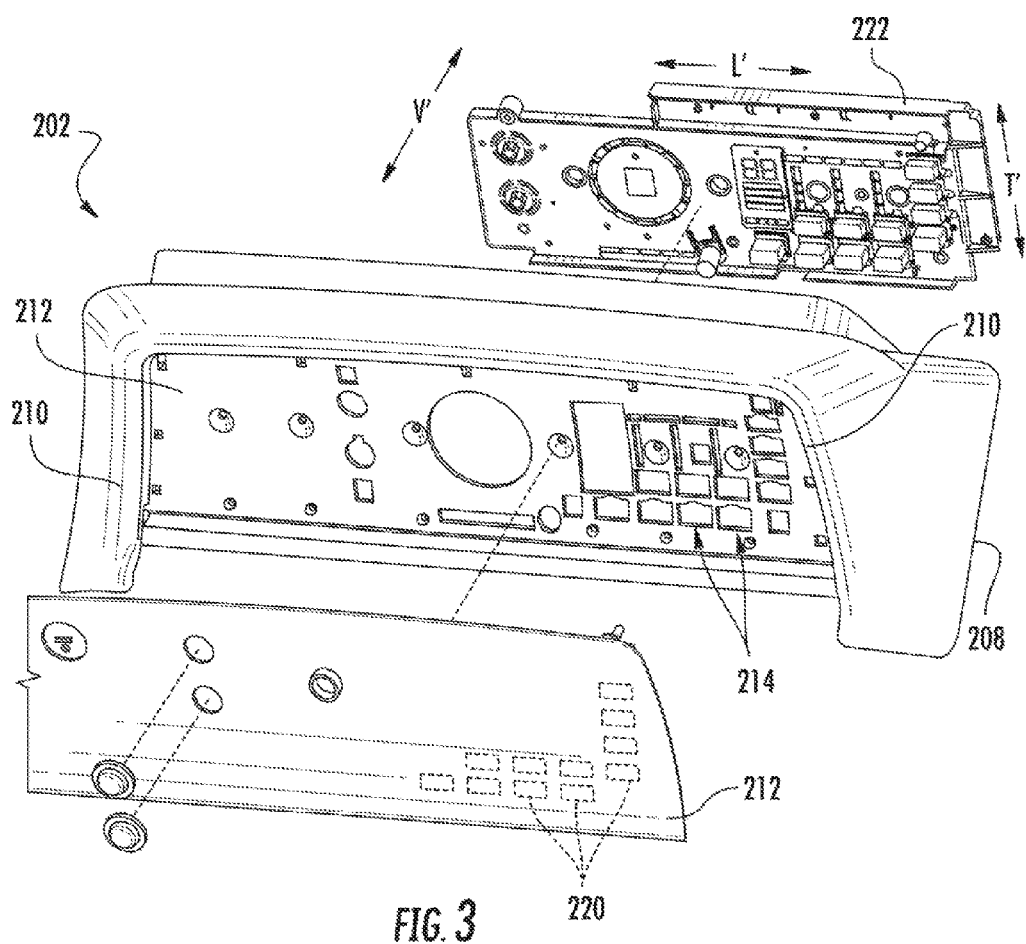
FIG. 3 provides an exploded view of a user interface in accordance with the exemplary top cover assembly of FIG. 2.
Figure 4:
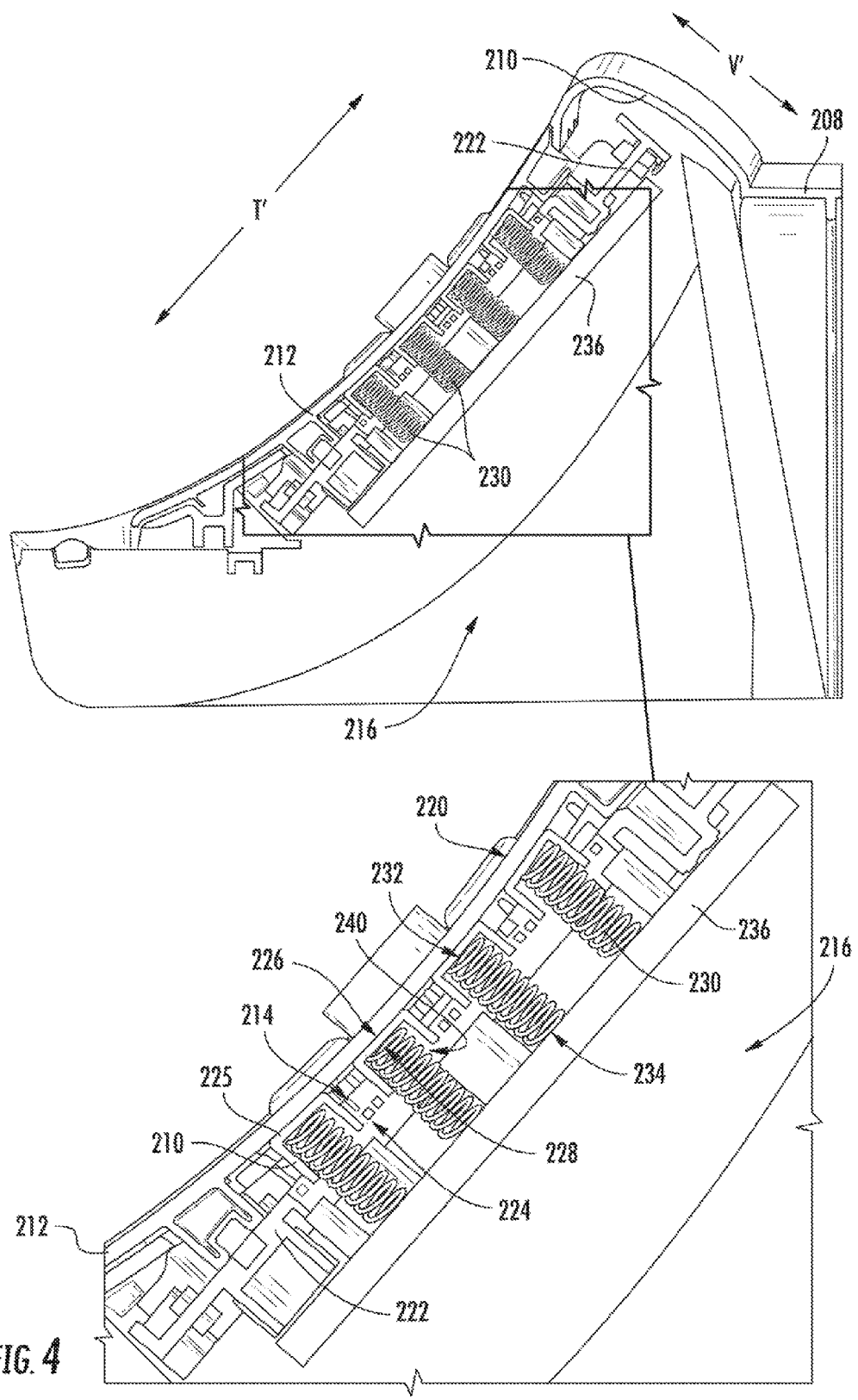
FIG. 4 provides a cross-sectional side view of the user interface, including a magnified portion, in accordance with the exemplary top cover assembly of FIG. 2.

Turning to FIGS. 2 through 4, an exemplary embodiment of a top cover assembly 200 is illustrated. As shown, a selectively removable backsplash 202 and user interface 206 is provided on a preformed top cover 204. It is understood that the backsplash 202, user interface, and top cover 204 could be embodied as backsplash 106, user interface 110, and top cover 104 illustrated in FIG. 1.

As illustrated, some embodiments of backsplash 202 include an enclosed housing 208 mounted to top cover 204. Enclosed housing 208 includes one or more perimeter walls 210 fixed to a preformed faceplate 212. In some such embodiments, faceplate 212 is embodied as a rigid plate defining one or more input apertures 214. Faceplate 212 may be substantially flat or at least partially curved. Perimeter wall 210 extends about faceplate 212 and rests on the top cover 204. Within perimeter wall 210 and faceplate 212, e.g., between faceplate 212 and top cover 204, enclosed housing 208 defines an internal volume 216. Internal volume 216 is generally positioned over top cover 204 and may contain at least a portion of user interface 206.

In exemplary embodiments, a touch panel 218 is disposed across a portion of enclosed housing 208 as an input selector. For instance, touch panel 218 may be disposed across faceplate 212. In some such embodiments, touch panel 218 substantially covers an outer-facing portion of faceplate 212, e.g., a portion of faceplate 212 that faces away from internal volume 216. Optionally, touch panel 218 may be a rigid member defining discrete capacitive touch zones 220 for input. During operation of the appliance 100 (see FIG. 1), a user's touch or engagement with the discrete touch zones 220 of the touch panel 218 may select or initiate one or more functions of the appliance 100, such as the mode of operation, water temperature selected, and other relevant information. At the touch panel 218, variations in capacitance caused by a user's engagement may be detected. In response, user interface 206 may cause one or more functions to be selected or initiated, e.g., via processing device 150 (see FIG. 1). Optionally, one or more of the touch zones 220 may be labeled, e.g., via a printed text or design, to indicate one or more functions to which the touch zone 220 corresponds.

In some embodiments, an input chassis 222 is provided as part of the user interface 206. Input chassis 222 may be formed as a substantially planar member and configured to mount to faceplate 212, e.g., within internal volume 216. Generally, input chassis 222 defines a unique vertical direction V', lateral direction L', and transverse direction T'. The vertical direction V', lateral direction L', and transverse direction T' are all mutually perpendicular and form an orthogonal chassis direction system. As shown, the orthogonal chassis direction system may be distinct from the orthogonal appliance direction system. When input chassis 222 is mounted onto the appliance 100 (see FIG. 1), the vertical direction V', lateral direction L', and transverse direction T' may each be fixed relative to the vertical direction V, lateral direction L, and transverse direction T. For instance, the vertical direction V' may be fixed at an angle that is not parallel to the vertical direction V.

In exemplary embodiments, input chassis 222 defines one or more connection apertures 224 extending therethrough. Connection apertures 224 may extend, e.g., parallel to the vertical direction V', as unimpeded passages through input chassis 222. Connection apertures 224 may be generally aligned with and complementary to input apertures 214 of the faceplate 212. In turn, connection apertures 224 may be aligned with capacitive touch zones 220 defined on touch panel 218.

As illustrated, certain embodiments of user interface 206 include one or more contact plates 225 positioned above input chassis 222, e.g., relative to the vertical direction V'. A top surface 226 of contact plate 225 may face away from input chassis 222, while an opposite bottom surface 228 faces toward input chassis 222. Each contact plate 225 may be aligned with a discrete connection aperture 224. In some such embodiments, contact plate 225 extends and is disposed directly over connection aperture 224 and blocks and least a portion of connection aperture 224, e.g., in the vertical direction V'. As illustrated, each contact plate 225 may be aligned with and correspond to a discrete capacitive touch zone 220 defined on touch panel 218. In some such embodiments, contact plate 225 is positioned directly below touch panel 218 in the vertical direction V'. Optionally, contact plate 225 may directly engage a portion of touch panel 218. For instance, top surface 226 of contact plate 225 may directly engage a portion of touch panel 218 that faces internal volume 216.

In exemplary embodiments, a conductive spring 230 extends through a connection aperture 224. Optionally, multiple conductive springs 230 may be provided at discrete connection apertures 224, e.g., such that each conductive spring 230 corresponds to a respective connection aperture 224. When mounted, a first end 232 of the conductive spring 230 is positioned above input chassis 222, e.g., in the vertical direction V', while a second end 234 of the conductive spring 230 is positioned below input chassis 222. First end 232 may be coupled to the contact plate 225 and to detect variations in capacitance that occur at a unique capacitive touch zone 220. Second end 234 may be coupled to a printed circuit board 236 and send/receive one or more signals between the conductive spring 230 and printed circuit board 236. Generally, printed circuit board 236 may be positioned below input chassis 222, e.g., in the vertical direction V'. Printed circuit board 236 is operably connected (e.g., electrically coupled) with or as a portion of processing device 150 (See FIG. 1) and processes signals to/from conductive spring 230.

In some embodiments, conductive spring 230 is formed from one or more conductive materials (e.g., copper, steel, etc.) as a helical compression spring. Conductive spring 230 is generally held in compression between contact plate 225 and printed circuit board 236. In certain embodiments, conductive spring 230 may be held in an interference fit between contact plate 225 and printed circuit board 236. For instance, an interference fit may couple conductive spring 230 to the bottom surface 228 of contact plate 225. In other embodiments, a distinct coupling (e.g., a fixed or soldered connection may couple the first end 232 of conductive spring 230 to the bottom surface 228. A similar interference fit or distinct coupling (e.g., a fixed soldered connection) may couple the second end 232 of conductive spring 230 to printed circuit board 236.

In some embodiments, a support wall 238 is disposed about a conductive spring 230. For instance, support wall 238 may be attached to input chassis 222 and extend thereabove, e.g., in the vertical direction V'. Support wall 238 generally extends from input chassis 222 and attaches to contact plate 225. Between input chassis 222 and contact plate 225, support wall 238 bounds conductive spring 230 in the lateral direction L' and the transverse direction T'.

Figure 5:
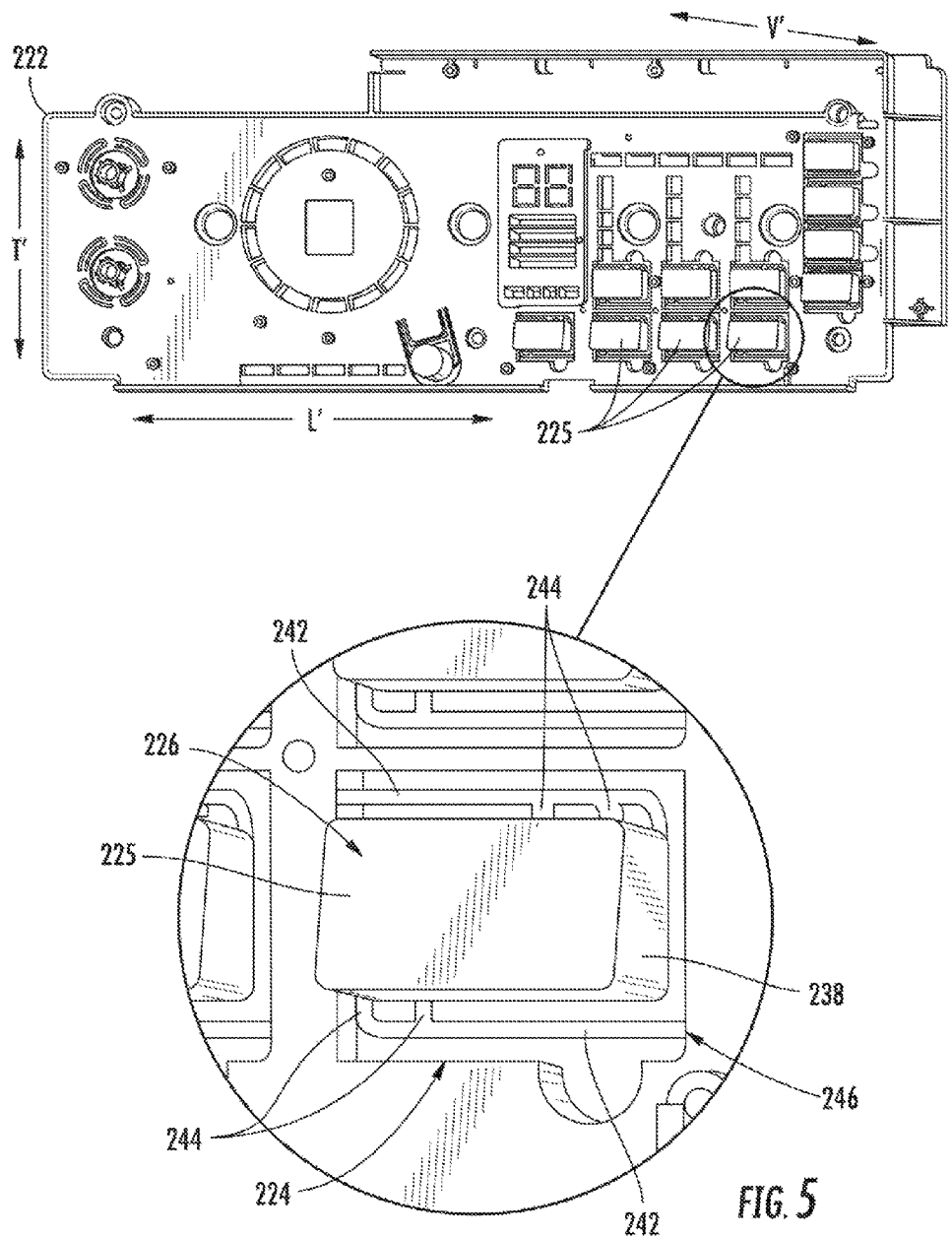
FIG. 5 provides a front perspective view of an interface assembly, including a magnified portion, in accordance with the exemplary user interface of FIG. 3.
Figure 6:
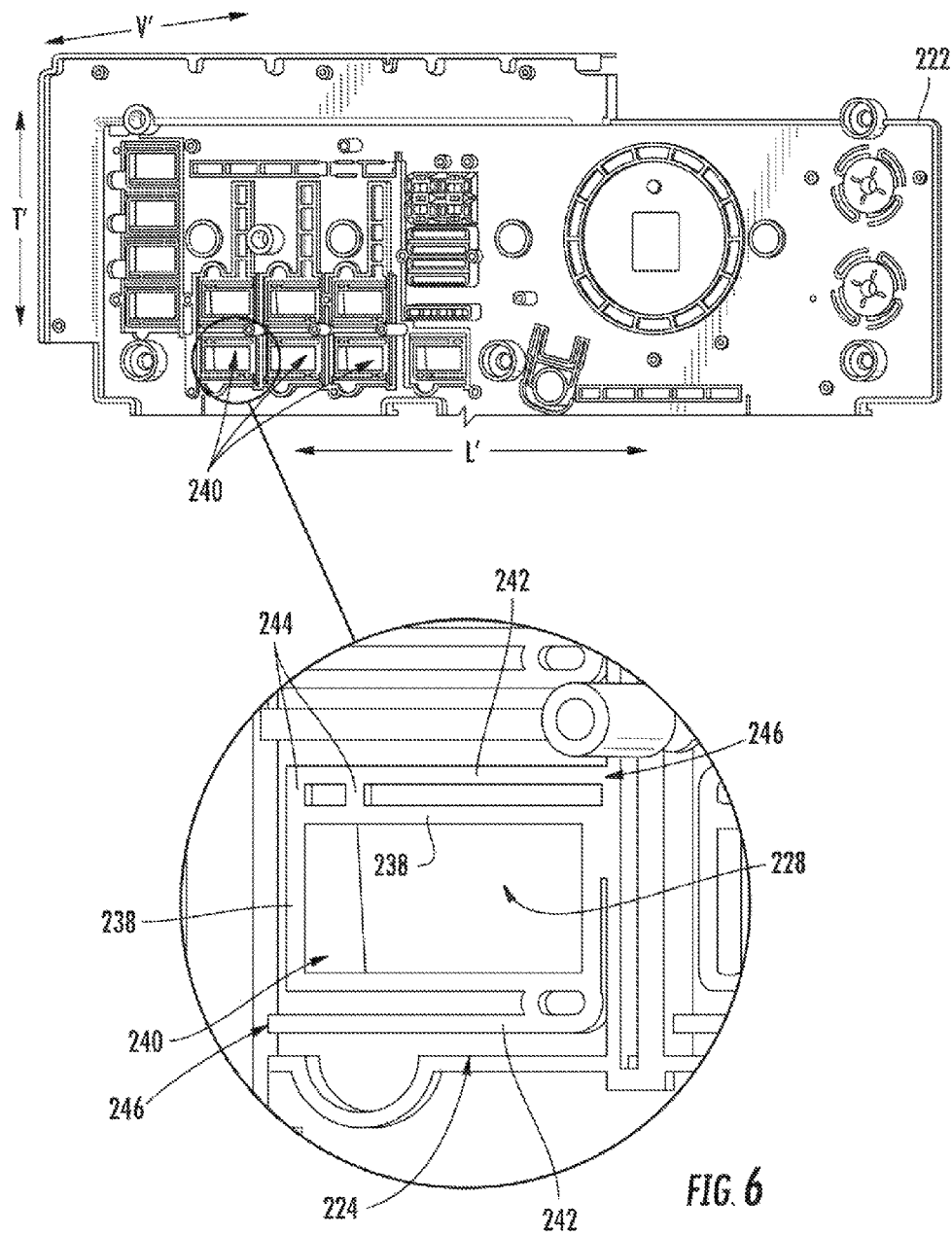
FIG. 6 provides a rear perspective view of an interface assembly, including a magnified portion, in accordance with the exemplary user interface of FIG. 3.

As shown in FIGS. 4 through 6, some embodiments of contact plate 225 and support wall 238 define a translatable pocket 240. For instance, contact plate 225 and support wall 238 may be attached as integral members such that contact plate 225 and support wall 238 form a single continuous piece of material, such as a plastic or metal material. When assembled, the pocket 240 may receive at least a portion of the conductive spring 230. Pocket 240 may support conductive spring 230 and prevent unwanted deflection of conductive spring 230, e.g., in the transverse direction T'.

As illustrated in FIGS. 4 through 6, one or more resilient members extend between support wall 238 and input chassis 222. In some embodiments, support wall 238 includes one or more resilient arms 242 that extend to the input chassis 222, e.g., in the lateral direction L'. Optionally, a resilient arm 242 may include two or more forked branches 244 that extend outward from support wall 238 (e.g., in the transverse direction T') before merging into a single arm attached to the input chassis 222. Resilient arm 242 may be formed from a suitable elastic material, such as one or more of polycarbonate, acrylonitrile butadiene styrene, polyethylene, polyvinyl, polyamide, etc. (e.g., PC-ABS). In exemplary embodiments, resilient arm 242 is fixed to input chassis 222 at an integral joint 246. For instance, resilient arm 242 may be formed from a common material with input chassis 222, e.g., such that resilient arm 242 and input chassis 222 form a single continuous piece of material. Additionally or alternatively, resilient arm 242 may form an integral joint with another portion of support wall 238.

As shown in FIG. 6 exemplary embodiments include at least two resilient arms 242 are provided at opposite transverse ends of support wall 238. Generally, each resilient arm 242 is attached to the contact plate 225 in biased engagement. Each resilient support arm 242 may urge contact plate 225 towards input chassis 222, e.g., downward along the vertical direction V'. Moreover, resilient support arm 242 may deflect, e.g., in the vertical direction V', in response to compression of conductive spring 230. At least a portion of the compression force generated from compression of conductive spring 230 may be directed through and/or absorbed by resilient support arms 242. This may advantageously reduce forces that might otherwise be directed to and/or damage printed circuit board 236.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance user interface comprising:
   an input chassis defining a connection aperture extending therethrough;
   a contact plate disposed above the connection aperture of the input chassis, the contact plate including a top surface facing away from the input chassis and a bottom surface facing toward the input chassis;
   a conductive spring coupled to the contact plate at the bottom surface of the contact plate, the conductive spring extending through the connection aperture and above the chassis;
   a printed circuit board attached to the conductive spring below the input chassis; and
   a support wall extending from the contact plate and disposed about the conductive spring between the contact plate and the connection aperture of the input chassis, wherein the support wall includes a resilient support arm attached to the contact plate in a biased engagement and extending to the input chassis in attachment therewith, and wherein the biased engagement urges the contact plate and spring towards the printed circuit board in an interference fit between the contact plate and the printed circuit board.

2. The appliance user interface of claim 1, further comprising an integral joint formed in connection with the support wall and the input chassis.

3. The appliance user interface of claim 1, further comprising a rigid touch panel disposed over the contact plate and across the input chassis.

4. An appliance user interface comprising:
   an input chassis defining a connection aperture extending therethrough;
   a contact plate disposed above the connection aperture of the input chassis, the contact plate including a top surface facing away from the input chassis and a bottom surface facing toward the input chassis;
   a conductive spring fixed to the bottom surface of the contact plate, the conductive spring extending through the connection aperture and above the chassis;
   a printed circuit board fixed to the conductive spring below the input chassis; and
   a support wall extending from the contact plate and disposed about the conductive spring between the contact plate and the connection aperture of the input chassis, the support wall including a resilient arm extending to the input chassis and integrally attached to the contact plate in a biased engagement, wherein an integral joint is formed in connection with the resilient arm and the input chassis, and wherein the biased engagement urges the contact plate and spring towards the printed circuit board in an interference fit between the contact plate and the printed circuit board.

5. The appliance user interface of claim 4, wherein the contact plate and the support wall define a translatable pocket containing at least a portion of the spring.

6. The appliance user interface of claim 4, further comprising a rigid touch panel disposed over the contact plate and across the input chassis.

7. An appliance comprising:
   a cabinet defining an opening for the receipt of articles to be treated;
   an interface bracket disposed on the cabinet; and
   a user interface disposed on the interface bracket, the user interface comprising
      an input chassis defining a connection aperture extending therethrough,
      a contact plate disposed above the connection aperture, the contact plate including a top surface facing away from the input chassis and a bottom surface facing toward the input chassis,
      a conductive spring fixed to the bottom surface of the contact plate, the conductive spring extending through the connection aperture and above the chassis;
      a printed circuit board attached to the conductive spring below the input chassis, and
      a support wall extending from the contact plate and disposed about the conductive spring between the contact plate and the connection aperture, wherein the support wall includes a resilient support arm attached to the contact plate in a biased engagement and extending to the input chassis in attachment therewith, and wherein the biased engagement urges the contact plate and spring towards the printed circuit board in an interference fit between the contact plate and the printed circuit board.

8. The appliance of claim 7, further comprising a rigid touch panel disposed over the contact plate and across the input chassis.

9. The appliance of claim 7, wherein the user interface includes an integral joint formed in connection with the support wall and the input chassis.

* * * * *